United States Patent [19]

Depiante

[11] Patent Number: 5,689,429
[45] Date of Patent: Nov. 18, 1997

[54] FINGER WEAR DETECTION FOR PRODUCTION LINE BATTERY TESTER

[76] Inventor: Eduardo V. Depiante, 16 W. 505 Mockingbird La., Apt. 204, Hinsdale, Ill. 60521-6621

[21] Appl. No.: 653,383

[22] Filed: May 24, 1996

[51] Int. Cl.⁶ .................................................. G01B 3/00
[52] U.S. Cl. ............... 364/481; 364/474.17; 364/551.02; 340/679; 340/680
[58] Field of Search ........................ 364/481, 565, 364/571.03, 474.17; 324/423–427, 430, 433, 435, 345; 340/455, 679, 680

[56] References Cited

U.S. PATENT DOCUMENTS 4,894,644  1/1990  Thomas ................................ 340/680
5,587,931  12/1996  Jones et al. ....................... 364/551.02

*Primary Examiner*—James P. Trammell
*Assistant Examiner*—Demetra R. Smith
*Attorney, Agent, or Firm*—Foley & Lardner

[57] ABSTRACT

A method for detecting wear in a battery tester probe. The method includes providing a battery tester unit having at least one tester finger, generating a tester signal using the tester fingers and battery tester unit with the signal characteristic of the electrochemical condition of the battery and the tester finger, applying wavelet transformation to the tester signal including computing a mother wavelet to produce finger wear indicator signals, analyzing the signals to create a finger wear index, comparing the wear index for the tester finger with the index for a new tester finger and generating a tester finger signal change signal to indicate achieving a threshold wear change.

7 Claims, 7 Drawing Sheets

FINGER WEAR DETECTION FOR PRODUCTION LINE BATTERY TESTER

The United States Government has rights in this invention pursuant to Contract No. W-31-109-ENG-38 between the U.S. Department of Energy and the University of Chicago.

The invention is concerned generally with a method and apparatus for detection of wear in production line machinery. More particularly, the invention is concerned with a finger wear detection apparatus and method for a production line battery tester probe.

The efficiency and reliability of industrial plants has become more than ever a relevant factor in efforts to improve product quality and increase plant production levels. New approaches to production such as total quality management emphasize, among other things, the early detection of problems with production machinery. A great deal of time and effort is usually spent in designing this equipment, so a comparable effort should be spent in maintaining reliable operation. Machine condition monitoring techniques potentially can provide early detection of machine wear problems and incipient failures.

In a particular form of machine wear testing system, a production line battery tester is located at the end of the battery production line; and its purpose is to assure that the batteries being shipped meet specifications. The mechanical fingers that provide electrical contact to measure voltage characteristics of the battery as it passes through the tester are known to wear down over a period of weeks. The number of false battery classifications increases as the wear progresses. Presently, the fingers of such battery tester units are inspected by sight for their state of wear and are replaced if wear is excessive. However, examining the fingers requires stopping the production line. Since such units are widespread there would be significant quality, efficiency, and yield improvements if wear could be monitored on-line during battery testing and the production line stopped to replace the fingers only at the optimum time.

It is therefore an object of the invention to provide an improved method and apparatus for sensing wear of machinery components.

It is another object of the invention to provide a novel method and apparatus for sensing wear of testing devices for machinery.

It is a further object of the invention to provide an improved method and apparatus for sensing wear of battery testing devices for battery production lines.

It is also an object of the invention to provide a novel method and apparatus for applying wavelet analysis techniques to wear or deterioration of a machine component.

These and other objects and advantages of the present invention will be readily apparent from the following description of the preferred embodiments thereof, taken in conjunction with the accompanying drawings described below.

DETAILED DESCRIPTION OF PREFERRED EMBODIMENT

Figure 1:
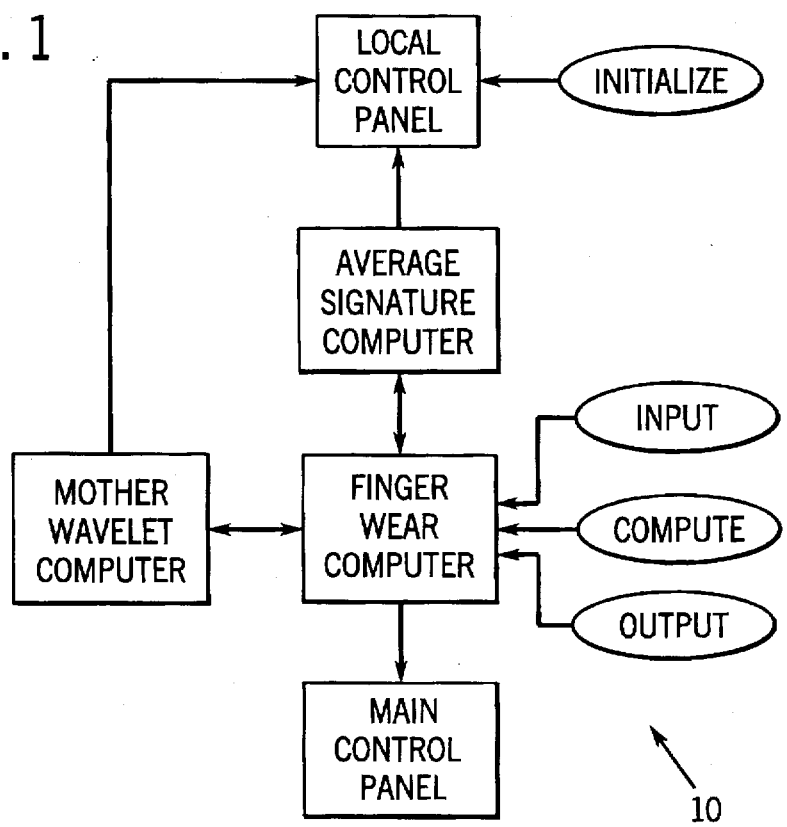
FIG. 1 illustrates a wavelet based signal analysis system computer software structure.
Figure 2:
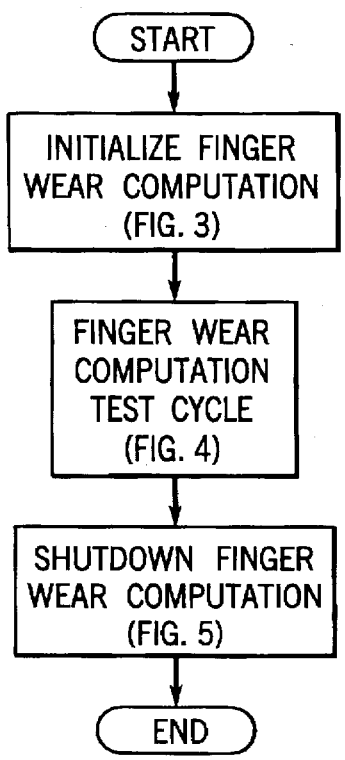
FIG. 2 illustrates a battery tester finger wear test program main driver flowchart.

An apparatus and method for battery tester finger wear detection is preferably carried out through the application of wavelet analysis to the signals available at the battery manufacturing facility. A computer software structure 10 (see FIG. 1) of the wavelet based signal analysis system developed for manufacturing company applications is used to compute a quantitative indicator of tester finger wear based on a wavelet analysis of the observed current-time relationship.

Pattern recognition techniques can be used to discover the relationships that exist between specific conditions of the tester or a battery and the associated response when a battery passes through the tester. Once these relationships have been determined, one can monitor tester response and can draw conclusions about the electro-chemical state of the current battery or the mechanical state of the tester.

A. Wavelet Analysis Pattern Recognition

For many years, the Fourier Transform technique has been used in a wide variety of application areas. In recent years there has been an increased interest in wavelets both from an applications and a mathematical perspective. The following sections provide a description of wavelets and the wavelet transform approach to the problem of tester unit finger wear detection.

The wavelet transform uses appropriately matched band-pass kernels, called "mother wavelets," thereby enabling improved representation and analysis of wideband, transient, and noisy signals. Generally, the principal advantages of the wavelet transform are (1) its localized nature which accepts less noise and enhances the signal-to-noise ratio, and (2) the new problem-solving paradigm if offers in the treatment of nonlinear problems.

Wavelets are constant-energy pulses of zero net area and of constant fidelity Q, where:

$$Q = \frac{\Delta f}{f} = \frac{\text{(bandwidth)}}{\text{(center frequency)}} \quad (1)$$

Constant fidelity refers to the fact that, like organ pipes, all wavelets have the same number of zero-crossings. In other words, a wavelet of short duration has a high frequency while a wavelet of long duration has a low frequency.

Mathematically, wavelets are defined simply as pulses $h_{a,b}(t)$ of "constant energy" and zero area derived from a single function according to the following equation:

$$h_{a,b}(t) = \frac{1}{\sqrt{a}} h\left(\frac{t-b}{a}\right), a = 2^0, 2^{\pm 1}, 2^{\pm 2}, \ldots \quad (2)$$

$$b = 0, \pm 1, \pm 2, \pm 3, \ldots$$

where:

$h(t)$=the so-called mother wavelet, $h_{a,b}(t)$=a daughter wavelet, $1/\sqrt{a}$=a normalization factor, a=time scale factor (wavelet dilation if a>1) varying by octaves, and b=time shift (forward if b>0).

The wavelet energy is given by the following inner or scalar product denoted by the angle brackets:

$$<h_{a,b}|h_{a,b}> = \int_{-\infty}^{\infty} dt\, h_{a,b}*(t)h_{a,b}(t) \quad (3)$$

$$= \int_{-\infty}^{\infty} \frac{dt}{a} h*\left(\frac{t-b}{a}\right) h\left(\frac{t-b}{a}\right)$$

$$= \int_{-\infty}^{\infty} dt'h*(t')h(t')$$

$$= <h|h> = \text{constant} < \infty;$$

where:

$$t' = \frac{t-b}{a}. \quad (4)$$

The zero area condition is:

$$\int_{-\infty}^{\infty} dt\, h_{a,b}(t) = 0; \quad (5)$$

or:

$$0 = \int_{-\infty}^{\infty} dt\, e^{-j2\pi f t} h_{a,b}(t)|_{f=0} = \text{(D.C. term)} \quad (6)$$

Wavelets are particularly suited for the finger wear application because the tester signals meet, or can be operated on to satisfy, the mathematical conditions of wavelet theory. One set of such conditions arises in the Completeness Theorem which is described here. One result is that the battery signals must be demeaned in order to satisfy the theorem.

The completeness theorem states that the family of daughter wavelets generated by the procedure of Eq. 2 based on the well known, affine transformation (similar to Eq. 4) forms a complete basis of the underlying function space; that is, any function of that space is decomposable and expressible in terms of this wavelet family, if and only if:

$$\int_{-\infty}^{\infty} \frac{|H(f)|^2}{|f|} df < \infty; \quad (7)$$

where:

$$H(f) = \int e^{-j2\pi f t} h(t) dt. \quad (8)$$

In other words, the admissible mother wavelet condition requires a bounded power spectral density and implies finite energy and zero area (Eqs. 3 and 5).

Figure 9:
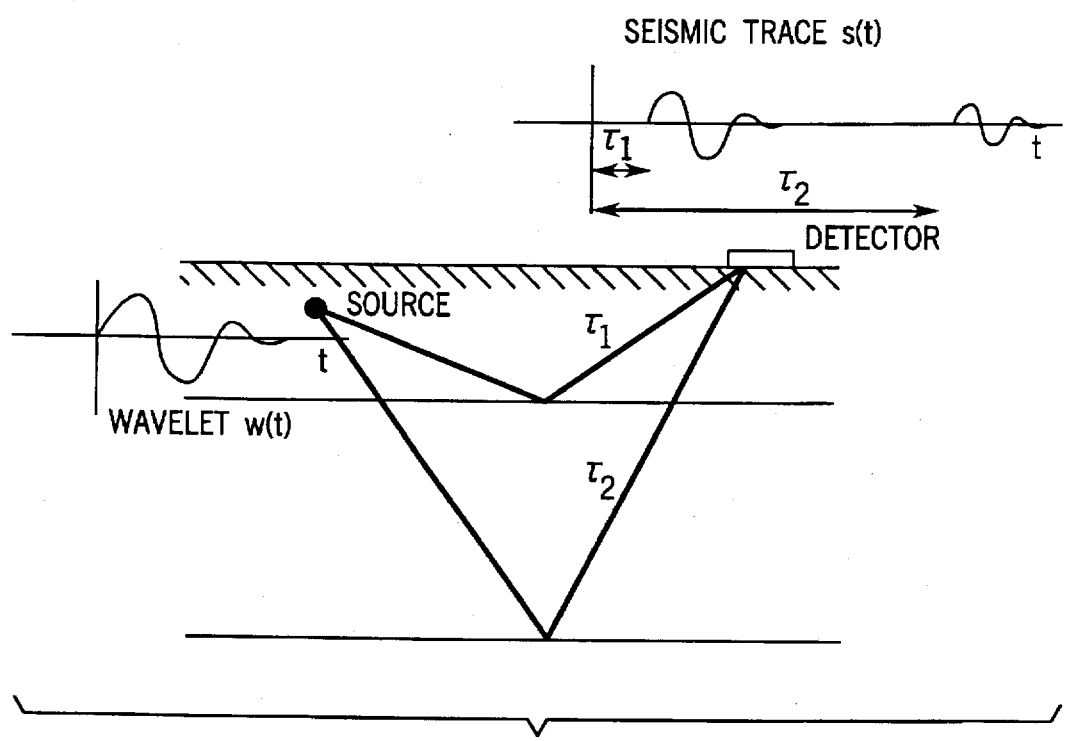
FIG. 9 illustrates usage of the wavelet technique in seismology.

What is now referred to as wavelets originated in exploration seismology where, typically, a series of subsurface charges are detonated and an array of surface detectors are used to record the reflected waves (see FIG. 9). A wavelet is a wave produced by an explosion. Since the charges are of finite power, the resulting wavelets are signals, transient or impulse, of finite energy:

$$\int_{-\infty}^{\infty} w*(t)w(t)dt < \infty. \quad (9)$$

As illustrated in FIG. 9, the received seismic signal is a superposition of the reflected wavelets from subsurfaces:

$$s(t) = \sum_i r_i w(t - \tau_i); \quad (10)$$

where $r_i$ designates the reflectivity associated with the wavelet received after a time delay $\tau_i$. Since the shape of all reflected pulses is the same as the original pulse from the explosion, the received seismic signal is expressed in Eq. 10 as a linear combination of a set of functions, all of which are obtained from a single function by simple time translations.

The signal processing consists of removing the effect of the wavelet from seismic trace data and of finding the subsurface's reflectivity function. If the reflectivity decays exponentially with depth, it indicates a homogeneous subsurface region; if, however, it does not, it suggests some kind of discontinuity which may indicate the presence of a deposit of a mineral resource. Using this wavelet technique, the technique was applied to find underground oil reservoirs.

The finger wear detection scheme in general uses the concept of the wavelet transform which is introduced in this section. Given a signal s(t), a wavelet transform may be defined as follows:

$$W_s(a,b) \equiv \int_{-\infty}^{\infty} dt\, h_{a,b}*(t)s(t) = <h_{a,b}|s>; \quad (11)$$

where the * denotes complex conjugation and where:
a=time scale factor, and
b=time shift.

Each wavelet coefficient is a constant obtained using the signal and a base element of the underlying infinite-dimensional Hilbert space $L^2(R)$ of square integrable functions. The base is a constant fidelity base, that is, affine generated and complete. An afine transformation replaces t by t' according to:

$$t \rightarrow t' = \frac{t-b}{a}. \quad (12)$$

All wavelets therefore satisfy:

$$\int_{-\infty}^{\infty} dt\, h_{a,b}*(t)h_{a,b}(t) < \infty. \quad (13)$$

The wavelet transform therefore takes a signal which is a function of a single variable, and outputs a coefficient which is a function of two variables.

B. Cluster Analysis.

Consider the problem of sorting same length sequences of numbers so that sequences that are similar or near to one another are put into one class while others that are dissimilar go into other classes. This is the goal of clustering analysis, and clustering methods operate according to rules that are heuristic in nature. No a priori assumptions about the relationships among the data are made. Generally, no conditioning of data is performed unless one is compensating for distortion or bandpass phenomena whose behavior are known. Cluster analysis is more difficult than the problem of simply finding the most representative class for a sequence when the classes are defined a priori (discriminate analysis). Them are many algorithms for cluster analysis although there is no generally accepted 'best' method. Different algorithms do not produce the same results on a given set of data; therefore, one should be careful in assessing the results from a particular method. The two most common approaches to cluster analysis are the partitioning and hierarchical approaches.

The partitioning method begins with a predetermined number of clusters as the objective and then partitions the objects to obtain the required clusters. To begin with, some more or less arbitrary group centers are chosen and individuals are allocated to the nearest one. New centers are then calculated where these are at the centers of the individuals in groups. An individual is then moved to a new group if it is closer to that group's center than it is to the center of its present group. Groups 'close' together are merged; and spread out groups are split. The process continues literally until stability is achieved with a predetermined number of groups. Usually a range of values is tried for the final number of clusters.

A finger wear index defined in terms of only one wavelet coefficient, namely, the one corresponding to a zero time shift ($a_o=1$) and unit dilation ($b_o=1$) factor:

$$F_I = W_s(a_o, b_o) \quad (14)$$

Generally, the wavelet coefficients associated with a given current-time signal s(t) are given by:

$$W_s(a,b) = \int_{-\infty}^{\infty} dt\, h_{a,b}^*(t) s(t) \quad (15)$$

where the asterisk denotes complex conjugation, a is the wavelet scale dilation, b is the wavelet time shift and $h_{a,b}$ are the daughter wavelets obtained from the mother wavelet according to:

$$h_{a,b}(t) = \frac{1}{\sqrt{a}} h\left(\frac{t-b}{a}\right) \quad (16)$$

In this application, the new finger case is used to determine the mother wavelet. In symbols:

$$h(t) = f(i_n(t)) \quad (17)$$

where f indicates the transformation necessary to bring the original current-time relationship for new fingers $i_n(t)$ into an admissible mother wavelet form.

In an on-line device for determining battery tenser finger wear, the software system processes battery signature data and determines finger wear. The design requirements and operational features of such a system (see FIG. 1) include the following:

1. The system computes the finger wear index.
2. When new fingers are installed, the operator must press a button in the main control panel to indicate this event, by an administrative control procedure.
3. The system receives the battery condition from a SPRT based type of algorithm (see U.S. Pat. Nos. 5,223,207 and 5,459,675 which are incorporated by reference herein).
4. The system generates the mother wavelet and an average signature to compute the finger wear index.
5. A new mother wavelet is defined if none exists or if a new finger has just been installed.
6. The collected mother wavelet is stored in battery-backed random access memory (RAM).
7. In normal operation, if a mother wavelet has been collected, regular collection of the signatures is performed, and the index is subsequently computed.

ANSI/ISO Standard C is a conventional software implementation language used herein (see Appendix). Unlike C++, the selected implementation language does not support object-oriented software design. However, the software is designed in an object-oriented fashion by structuring it into major entities which group certain data ("attributes") and functions ("behaviors") to access/process the data, and which are hereinafter referred to loosely as objects. Objects interact by "sending messages" to each other. Messages are simply function calls. The interrelationship between objects, messages, and the overall program flow is given in FIG. 1.

The major objects in the software system, and their principal associated attributes and behaviors are described herein below and in FIGS. 2–8.

A main control panel stores the status of the new finger button. It has associated functions to set and reset this button. Whenever new fingers are installed, the button status will reflect this condition. Its value is accessed by the finger wear computer object to determine when a new mother wavelet must be recomputed as a consequence of a changing of the fingers. A power status indicator has also been defined with its associated set/reset functions for possible use in recovering from a power failure. The mother wavelet is stored in battery-backed RAM and therefore would not need to be recomputed. There is also an associated object initialization function, but this object sends no messages to other objects.

A local control panel object stores some of the parameters used in the computation of the mother wavelet and average signature such as the number of units over which to collect, and whether or not a speed normalization is to be performed during the collection. Associated functions include initialization and functions to store, recall, and modify the current values of the data attributes. No messages are sent by this object. Messages are received by this object from the mother wavelet computer and average signature computer objects.

A battery tester finger wear computer object stores the current signature set, which includes the signature array and associated information including the unit condition, and the current finger wear index set which is simply the set of the index and the index cutoff value for finger replacement. Its associated functions perform object initialization; store and modify the current signature set and the finger wear index set; and compute the finger wear index. The latter may be considered the main function and uses the mother wavelet and average signature to obtain the finger wear index which is stored in the object's current finger wear index set. This object sends messages to the main control panel to find or reset the new finger button status; to the mother wavelet computer to compute the mother wavelet, reset the number of collected units running total, or find the mother wavelet computation status; and to the average signature computer to compute the average signature, reset the number of collected units running total, or find the average signature computation status.

A mother wavelet computer object stores the mother wavelet array in battery-backed RAM, is computation status, the number of collection units used to define the mother wavelet and its running total, and the speed normalization mode. Associated functions include object initialization; functions to store, recall, and modify the mother wavelet array, the number of collection units and its running total, and the speed normalization mode; and a function to compute the mother wavelet. This object sends messages to the local control panel to get the number of collection units and the speed normalization mode to be used in defining the mother wavelet; and the finger wear computer determines the current signature set which is used to define the mother wavelet.

An average signature computer object stores the average signature array in battery-backed RAM, its computation status, the number of collection units used to define the average signature and its running total, and the speed normalization mode. Associated functions include object initialization; functions to store, recall, and modify the average signature array, the number of collection units and its running total and the speed normalization mode; and a function to compute the average signature. This object sends messages to the local control panel to get the number of collection units and the speed normalization mode to be used in defining the average signature and also to the finger wear computer to get the current signature set which is used to define the average signature.

Figure 3:
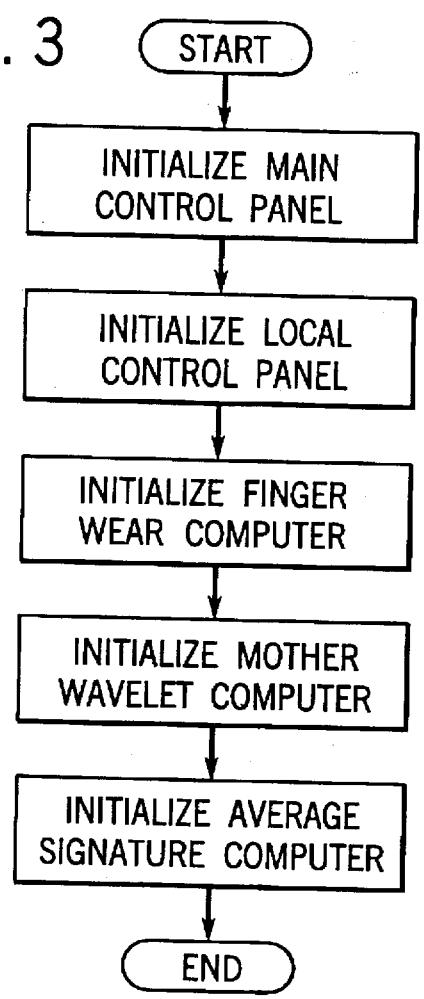
FIG. 3 illustrates a flowchart showing initialization of finger wear testing.
Figure 5:
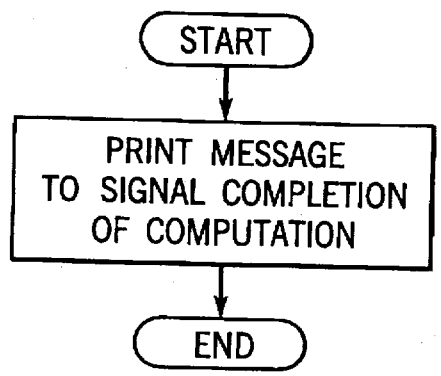
FIG. 5 illustrates a flowchart of finger wear testing and shutdown.
Figure 4:
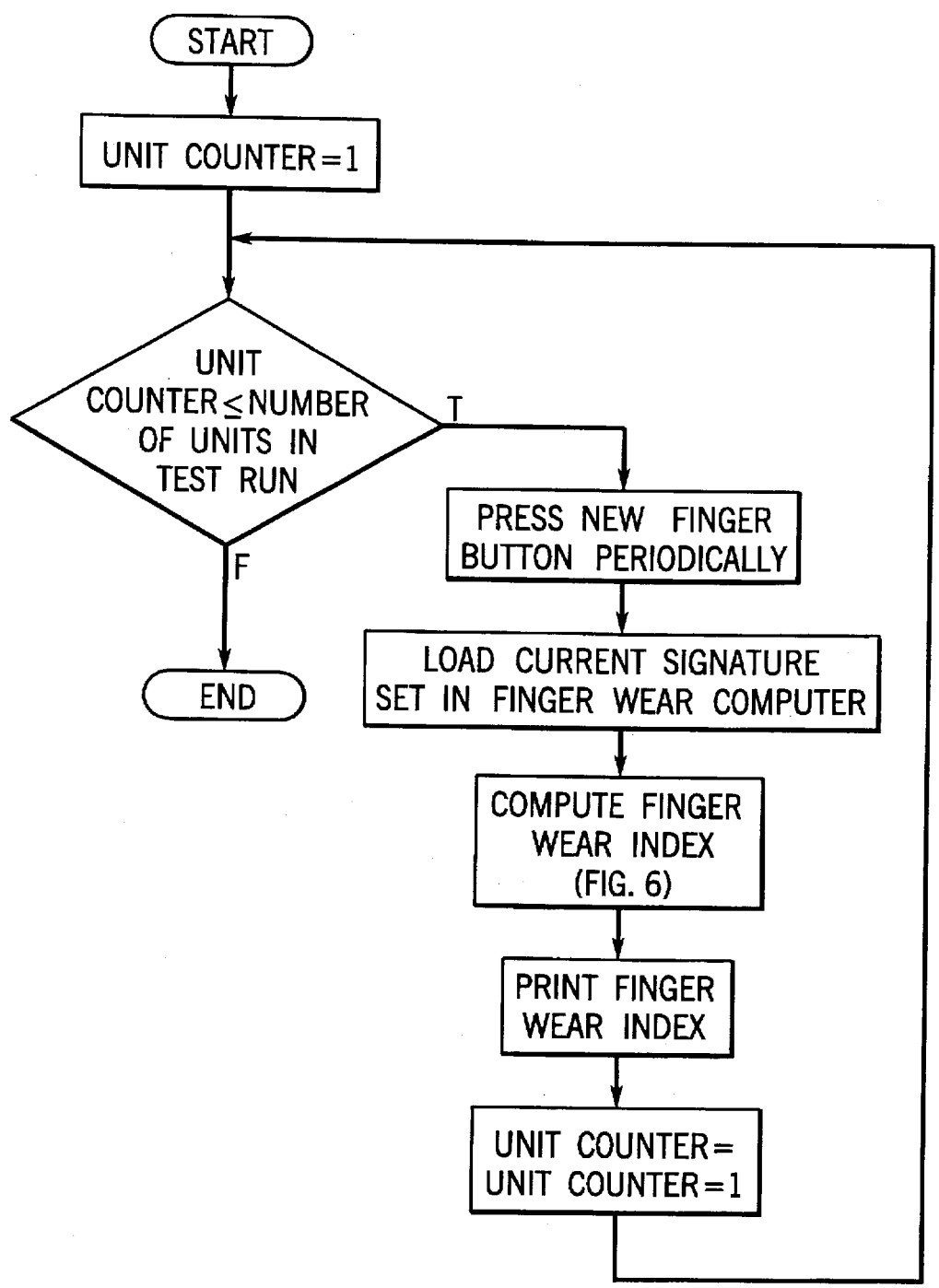
FIG. 4 illustrates a flowchart of a finger wear test cycle.
Figure 6:
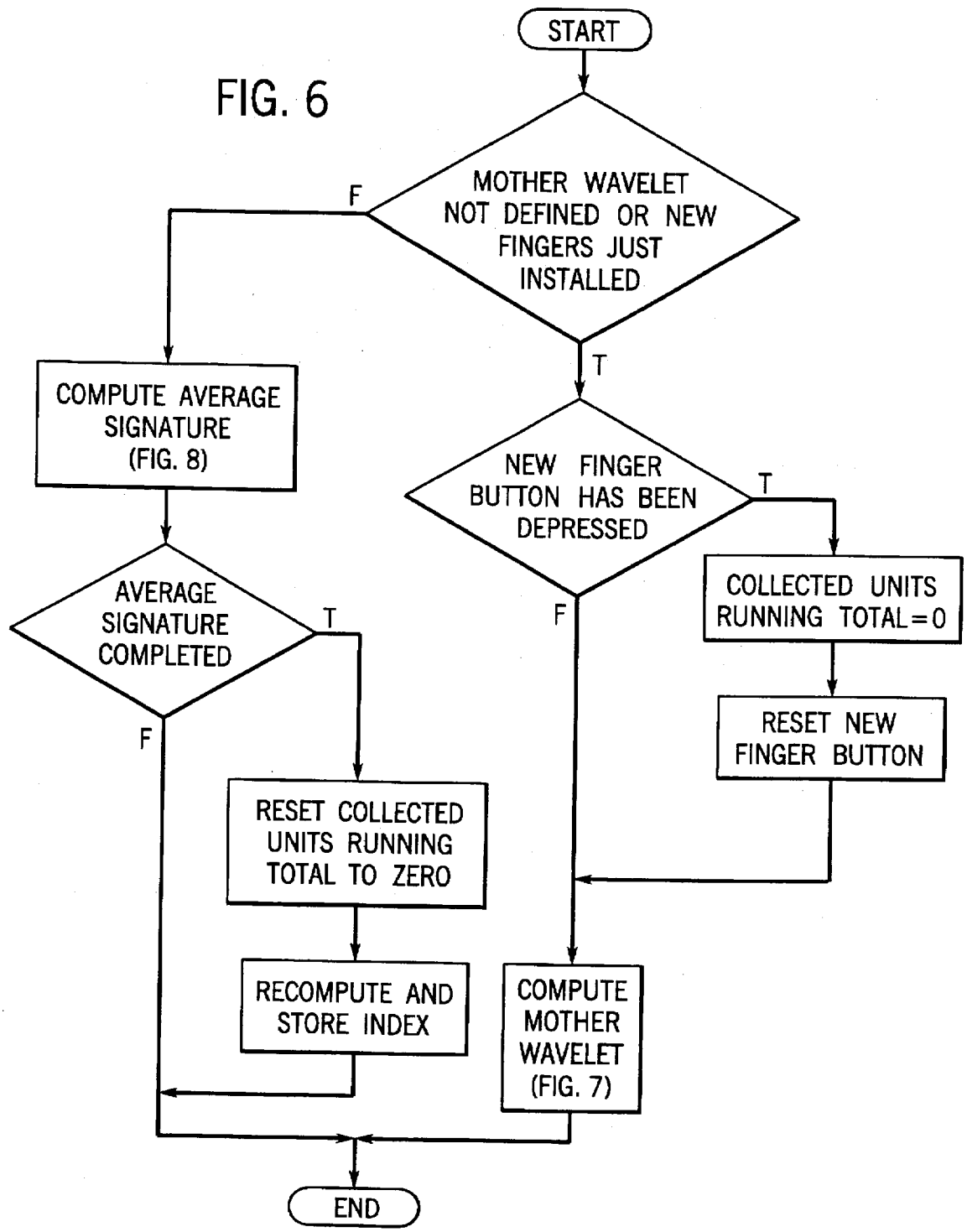
FIG. 6 illustrates a flowchart of computation of a finger wear index.
Figure 7:
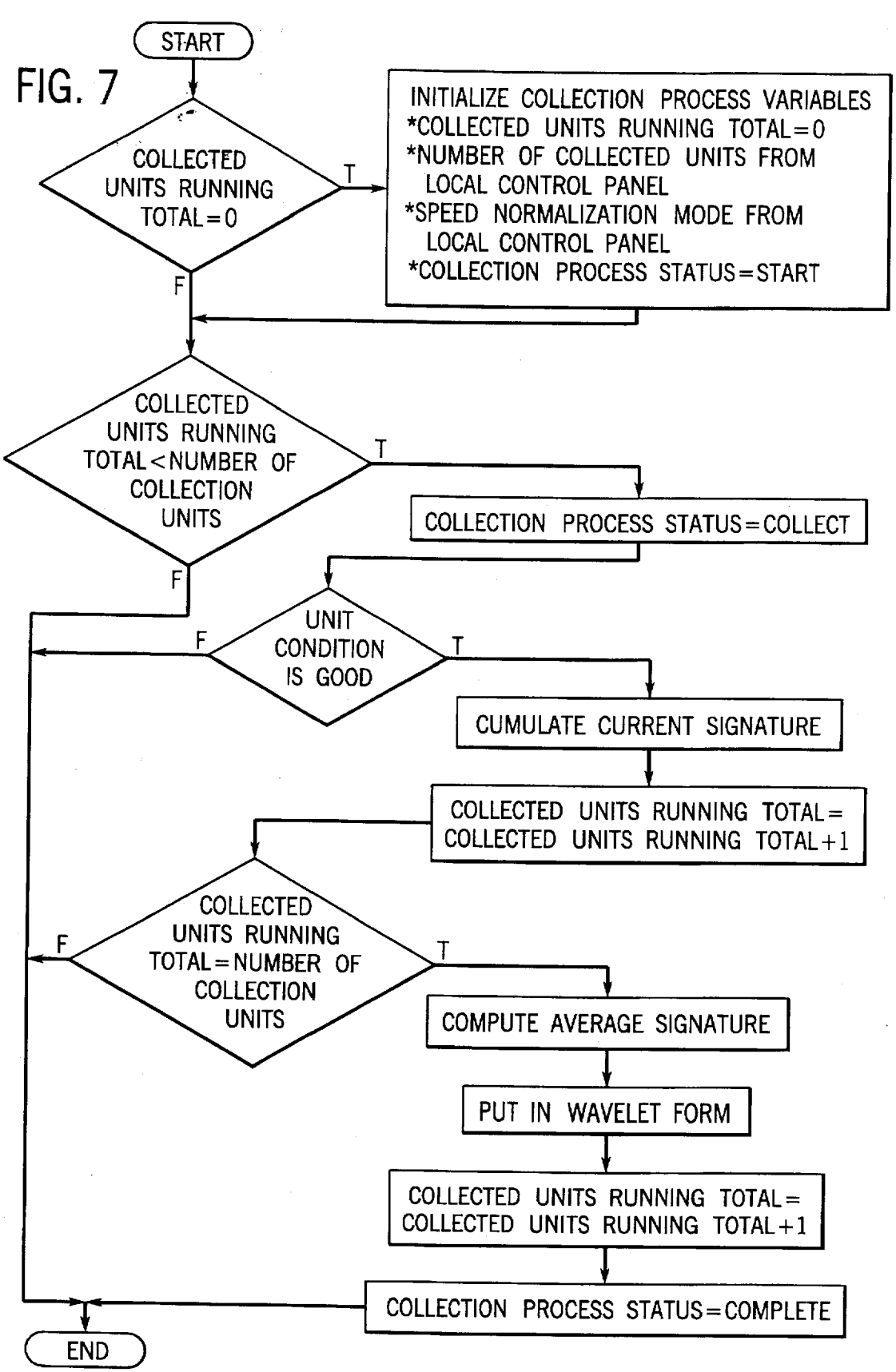
FIG. 7 illustrates a flowchart of computation of a mother wavelet.
Figure 8:
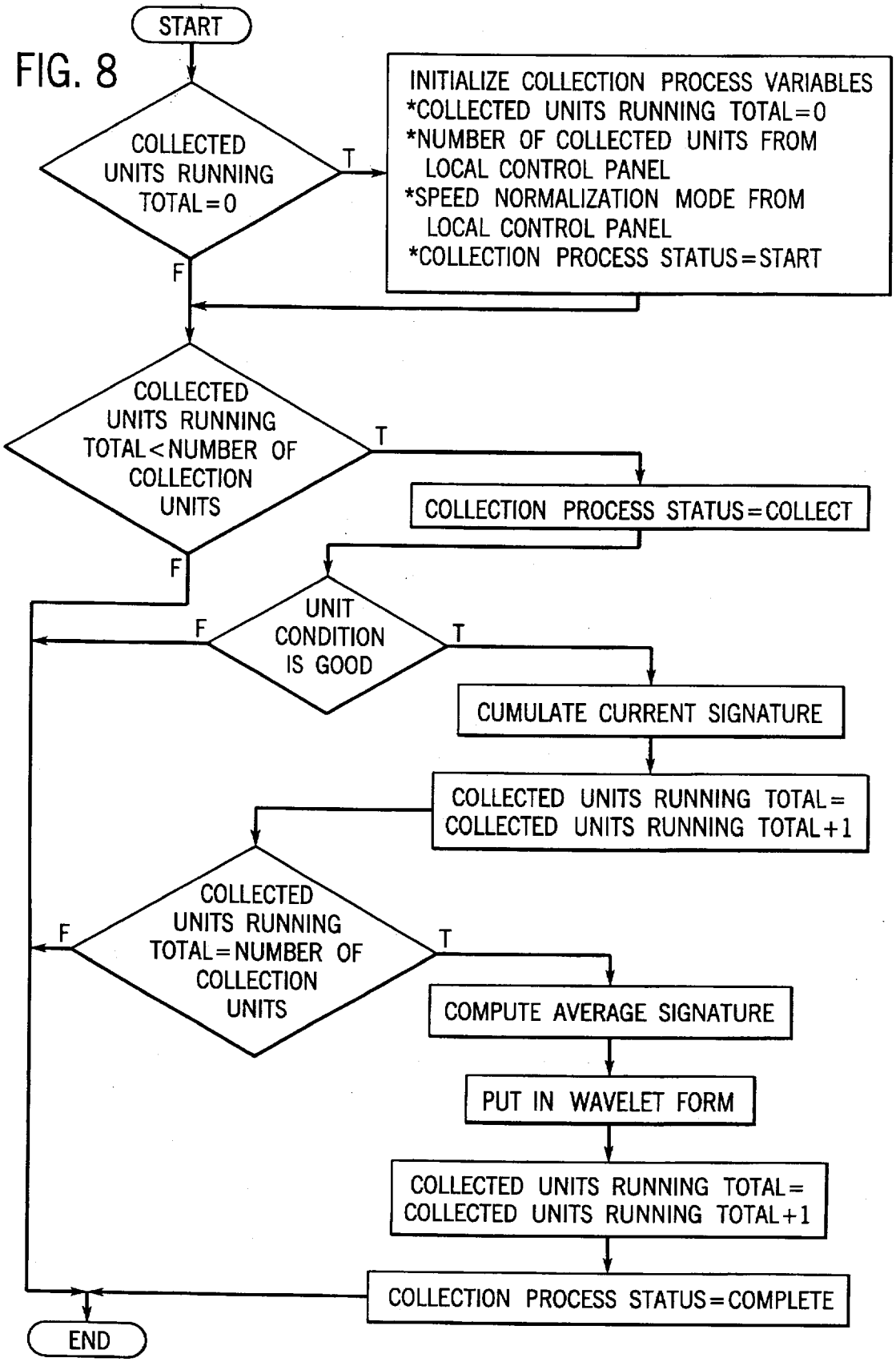
FIG. 8 illustrates a flowchart of computation of an average signature signal.

Flow charts for each of the finger wear software elements appear in FIGS. 2–8. Listings of the computer software are given in the attached Appendix. The main driver of the finger wear software appears in FIG. 2; its three main portions are shown in FIGS. 3–5, respectively. The computation of the finger wear index is shown in FIG. 6 and the computation of the mother wavelet and average signature is given in FIGS. 7 and 8, respectively.

The overall program flow of the wavelet based signal analysis system software appears on the right of FIG. 1 and consists of four major steps: initialize, input, compute, and output. Each of these is simply a notion call or message sent to the indicated object. Generally, the unit condition must be known before executing the finger wear index computation; therefore, the SPRT based software must execute first. The function calls associated with each step are the following:

1. Initialize: Send any desired messages to override the defaults to the local control panel such as to set the number of collection units and/or the speed normalization mode.

2. Input: Transfer the latest signature to the finger wear computer by setting the current signature set which includes the actual signature array and associated information including the unit condition as determined by the SPRT based software, the belt speed as determined from the time at which the photocell triggers.

3. Compute: Compute the new finger wear index by sending a "compute finger wear index" message to the finger wear computer.

4. Output: Get the latest finger wear index by sending a "current finger wear index set et" message to the finger wear computer.

While preferred embodiments of the invention have been shown and described, it will be clear to those skilled in the art that various changes and modifications can be made without departing from the invention in its broader aspects as set forth in the claims provided hereinafter.

APPENDIX

SOFTWARE LISTING

```c
/* */
/* */
/* Wavelet Based Finger Wear Software */
/* Version 1.0 R */
/* */
/* header file: START */
/* constant definitions: START */
const int ZERO = 0;

const int FBON = 11; /* new finger button is on */
const int FBOFF = 12; /* new finger button is off */
const int PON = 21; /* power is on */
const int POFF = 22; /* power is off */
const int SON = 31; /* speed normalization mode is on */
const int SOFF = 32; /* speed normalization mode is off */
const int BGOOD = 41; /* unit is good */
const int BBAD = 42; /* unit is bad */ const int START = 61; /* mother wavelet collection status */
const int COLLECT = 62; /* mother wavelet collection status */
const int COMPLETE = 63; /* mother wavelet collection status */ static int MWDEFINEDM = 61; /* mother wavelet collection status */
static int MWDEFINEDA = 61; /* average signature collection status */ const int NCOL0 = 100; /* default number of collection units */
define NSIGARRAY 126 /* length for signature arrays */
const double ICUTOFF = 0.8000; /* finger wear index cutoff value */

/* pointers to objects: START */
static struct mcp_type * MCP;
static struct lcp_type * LCP;
static struct fwc_type * FWC;
static struct mwc_type * MWC;
static struct mwc_type * ASC;
/* pointers to objects: END */
/* constant definitions: END */

/* define objects: START */
```

```
static struct mcp_type mcp; /* main control panel */
static struct lcp_type lcp; /* local control panel */
static struct fwc_type fwc; /* finger wear computer */
static struct mwc_type mwc; /* mother wavelet computer */
static struct mwc_type asc; /* average signature computer */
/* define objects: END */

/* function prototypes: START */
void main(void);
void init_wear(void);
void test_wear(void);
void shutdown_wear(void);
/* function prototypes: END */

/* main control panel: START */
static struct mcp_type /* mcp = main control panel */
{
  /* attributes */
  struct mcp_type *this;
  int nfb_status; /* nfb = new finger button */
  int power_status;
  /* behaviors */
  /* standard behaviors */
  void (*mcp_type_init)();
  /* other behaviors */
  void (*nfb_set)();
  void (*nfb_reset)();
  void (*power_set)();
  void (*power_reset)();
};
/* function prototypes: START */
void mcp_type_ginit(struct mcp_type *z);
void mcp_type_gprint(struct mcp_type *z);

void nfb_gset(struct mcp_type *z);
void nfb_greset(struct mcp_type *z);

void power_gset(struct mcp_type *z);
void power_greset(struct mcp_type *z);
/* function prototypes: END */
/* main control panel: END */
```

```c
/* local control panel: START */
static struct lcp_type /* lcp=local control panel */
{
  /* attributes */
  struct lcp_type *this;
  int ncol; /* number of collection units */
  int snm; /* speed normalization mode */
  /* behaviors */
  /* standard behaviors */
  void (*lcp_type_init)();
  /* other behaviors */
  void (*ncol_set)();
  void (*ncol_reset)();
  int (*ncol_get)();
  void (*snm_set)();
  void (*snm_reset)();
  int (*snm_get)();
};
/* function prototypes: START */
void lcp_type_ginit(struct lcp_type *z);
void lcp_type_gprint(struct lcp_type *z);

void ncol_gset(struct lcp_type *z, int ncolnew);
void ncol_greset(struct lcp_type *z);
int ncol_gget(struct lcp_type *z);

void snm_gset(struct lcp_type *z, int snmnew);
void snm_greset(struct lcp_type *z);
int snm_gget(struct lcp_type *z);
/* function prototypes: END */
/* local control panel: END */

/* finger wear computer: START */
struct sigset_type
{
  double sigarray [NSIGARRAY];
  double beltspeed;
  int bcondition;
  double timephoto; /* time at which the photocell triggers */
};

struct indexset_type
```

```
{
  double index;
  double cutoff;
};
static struct fwc_type /* fwc = finger wear computer */
{
  /* attributes */
  struct fwc_type *this;
  struct sigset_type sigset; /* sigset = current signature set */
  struct indexset_type indexset; /* indexset = current finger wear index set */
  /* behaviors */
  /* standard behaviors */
  void (*fwc_type_init)();
  /* other behaviors */
  void (*sigset_set)();
  void (*sigset_reset)();
  void (*indexset_set)();
  void (*indexset_reset)();
  void (*compute)();
  double (*quadrature)();
};
/* function prototypes: START */
void fwc_type_ginit(struct fwc_type *z);
void fwc_type_gprint(struct fwc_type *z);

void sigset_gset(struct fwc_type *z, struct sigset_type sigsetnew);
void sigset_greset(struct fwc_type *z);

void indexset_gset(struct fwc_type *z, struct indexset_type indexsetnew);
void indexset_greset(struct fwc_type *z);

void fwc_gcompute(struct fwc_type *z);
double fwc_gquadrature(double *x1, double *x2);
/* function prototypes: END */
/* finger wear computer: END */

/* mother wavelet computer: START */
static struct mwc_type /* mwc = mother wavelet computer */
{
  /* attributes */
  struct mwc_type *this;
  int * mwdefined; /* mother wavelet defined */
```

```
    double mwarray[NSIGARRAY]; /* stored mother wavelet array
                                  (battery-backed RAM) */
    int ncol; /* number of colleciton units */
    int snm; /* speed normalization mode */
    int icol; /* running total of the number of collected units */
    /* behaviors */
    /* standard behaviors */
    void (*mwc_type_init)();
    /* other behaviors */
    void (*mwa_set)();
    void (*mwa_reset)();
    double * (*mwa_get)(); /* double (*) [] ??? */ void (*ncol_set)();
    void (*ncol_reset)();
    int (*ncol_get)();

void (*snm_set)();
    void (*snm_reset)();
    int (*snm_get)();

void (*icol_set)();
    void (*icol_reset)();
    int (*icol_get)();

void (*compute)();
    void (*wtize)();
};
/* function prototypes: START */ void mwc_type_init(struct mwc_type *z, int * mwdefined);
void mwc_type_gprint(struct mwc_type *z);

void mwc_mwa_set(struct mwc_type *z, double * mwanew);
void mwc_mwa_reset(struct mwc_type *z);
double * mwc_mwa_get(struct mwc_type *z);

void mwc_ncol_set(struct mwc_type *z, int ncolnew);
void mwc_ncol_reset(struct mwc_type *z);
int mwc_ncol_get(struct mwc_type *z);

void mwc_snm_set(struct mwc_type *z, int snmnew);
```

```
void mwc_snm_reset(struct mwc_type *z);
int mwc_snm_get(struct mwc_type *z);

void mwc_icol_set(struct mwc_type *z, int icolnew);
void mwc_icol_reset(struct mwc_type *z);
int mwc_icol_get(struct mwc_type *z);

void mwc_gcompute(struct mwc_type *z);
void mwc_gwtize(double *x);
/* function prototypes: END */
/* mother wavelet computer: END */

/* Wavelet Based Finger Wear Software */
/* Version 1.0 R */
/* */
/* */
/* include header file(s): START */
#include <math.h>
#include "fwc.h"
/* include header file(s): END */

/* executable file: START */

/* main control panel: START */
void mcp_type_ginit(struct mcp_type *z)
{
   /* This function initializes the attributes and behaviors associated with the main
      control panel */
   /* attributes */
   z->this = z; /* pointer to itself */
   z->nfb_status = FBOFF; /* new finger button */
   z->power_status = PON;
   /* behaviors */
   /* standard behaviors */
   z->mcp_type_init = mcp_type_ginit;
   /* other behaviors */
   z->nfb_set = nfb_gset;
   z->nfb_reset = nfb_greset;
   z->power_set = power_gset;
   z->power_reset = power_greset;
};
```

```c
void mcp_type_gprint(struct mcp_type *z)
{
  /* This function prints the attributes and [pointers to] behaviors associated with
     the main control panel */
  /* attributes */
  printf("\n");
  printf("mcp.this = %p\n", z->this);
  printf("mcp.nfb_status = %d\n", z->nfb_status);
  printf("mcp.power_status = %d\n", z->power_status);
  /* behaviors */
  /* standard behaviors */
  printf("mcp.mcp_type_init = %p\n", z->mcp_type_init);
  /* other behaviors */
  printf("mcp.nfb_set = %p\n", z->nfb_set);
  printf("mcp.nfb_reset = %p\n", z->nfb_reset);

printf("mcp.power_set = %p\n", z->power_set);
  printf("mcp.power_reset = %p\n", z->power_reset);
  printf("\n");
};

void nfb_gset(struct mcp_type *z)
{
  /*This function sets the new finger button of the main control panel, signaling
    that new fingers have just being installed */
  /* attributes */
  z->nfb_status = FBON;
};

void nfg_greset(struct mcp_type *z)
{
  /* This function resets the new finger button of the main control panel */
  /* attributes */
  z->nfb_status = FBOFF;
};

void power_gset(struct mcp_type *z)
{
  /*This function sets the power status button of the main control panel */
  /* attributes */
  z->power_status = PON;
```

```
};

void power_greset(struct mcp_type *z)
{
  /* This function resets the power status button of the main control panel */
  /* attributes */
  z->power_status = POFF;
};
/* main control panel: END */

/* local control panel: START */
void lcp_type_ginit(struct lcp_type *z)
{
  /* This function initializes the attributes and behaviors associated with the local
     control panel */
  /* attributes */
  z->this = z; /* pointer to itself */
  z->ncol = NCOL0; /* number of collection units */
  z->snm = SOFF; /* speed normalization mode */
  /* behaviors */
  /* standard behaviors */
  z->lcp_type_init = lcp_type_ginit;
  /* other behaviors */
  z->ncol_set = ncol_gset;
  z->ncol_reset = ncol_greset;
  z->ncol_get = ncol_gget;
  z->snm_set = snm_gset;
  z->snm_reset = snm_greset;
  z->snm_get = snm_gget;
};

void lcp_type_gprint(struct lcp_type *z)
{
  /* This function prints the attributes and [pointers to] behaviors associated with
     the local control panel */
  /* attributes */
  printf("\n");
  printf("lcp.this = %p\n", z->this);
  printf("lcp.ncol = %d\n", z->ncol);
  printf("lcp.snm = %d\n", z->snm);
  /* behaviors */
  /* standard behaviors */
```

```
        printf("lcp.lcp_type_init = %p\n", z->lcp_type_init);
        /* other behaviors */
        printf("lcp.ncol_set = %p\n", z->ncol_set);
        printf("lcp.ncol_reset = %p\n", z->ncol_reset);
        printf("lcp.ncol_get = %p\n", z->ncol_get);

printf("lcp.snm_set = %p\n", z->snm_set);
        printf("lcp.snm_reset = %p\n", z->snm_reset);
        printf("lcp.snm_get = %p\n", z->snm_get);
        printf("\n");
};

void ncol_gset(struct lcp_type *z, int ncolnew)
{
        /* This function sets the number of collection units of the local control panel to
           an argument-specified value */
        /* attributes */
        z->ncol = ncolnew;
};

void ncol_greset(struct lcp_type *z)
{
        /* This function resets the number of collection units of the local control panel to
           a header-file-specified default value */
        /* attributes */
        z->ncol = NCOL0;
};

int ncol_gget(struct lcp_type *z)
{
        /* This function returns the number of collection units of the local control panel
           */
        /* attributes */
        return z->ncol;
};

void snm_gset(struct lcp_type *z, int snmnew)
{
        /* This function sets the speed normalization mode of the local control panel to
           an argument-specified value */
        /* attributes */
        z-> snm = snmnew;
```

};

```
void snm_greset(struct lcp_type *z)
{
  /* This function resets the speed normalization mode of the local control panel */
  /* attributes */
  z->snm = SOFF;
};

int snm_gget(struct lcp_type *z)
{
  /* This function returns the speed normalization mode of the local control panel
      */
  /* attributes */
  return z->snm;
};
/* local control panel: END */

/* finger wear computer: START */
void fwc_type_ginit(struct fwc_type *z)
{
  /* This function initializes the attributes and behaviors associated with the finger
      wear computer */
  /* attributes */
  z->this = z; /* pointer to itself */
  sigset_greset(z); /* reset signature set */
  indexset_greset(z); /* reset index set */
  /* behaviors */
  /* standard behaviors */
  z->fwc_type_init = fwc_type_ginit;
  /* other behaviors */
  z->sigset_set = sigset_gset;
  z->sigset_reset = sigset_greset;
  z->indexset_set = indexset_gset;
  z->indexset_reset = indexset_greset;
  z->compute = fwc_gcompute;
  z->quadrature = fwc_gquadrature;
};

void fwc_type_gprint(struct fwc_type *z)
{
```

```
/* This function prints the attributes and [pointers to] behaviors associated with
    the finger wear computer */
int ii;
/* attributes */
printf("\n");
printf("fwc.this = %p\n", z->this);
for(ii = 0; ii < NSIGARRAY; ii++)
    printf("%p->sigset.sigarray [%i] = %g\n", z, ii, z->sigset.sigarray[ii]);
printf("fwc.sigset.beltspeed = %g\n, z->sigset.beltspeed);
printf("fwc.sigset.bcondition = %d\n", z->sigset.bcondition);
printf("fwc.sigset.timephoto = %g\n", z->sigset.timephoto);
printf("fwc.indexset.index = %g\n", z=>indexset.index);
printf("fwc.indexset.cutoff = %g\n", z->indexset.cutoff);
/* behaviors */
/* standard behaviors */
printf("fwc.fwc_type_init = %p\n", z->fwc_type_init);
/* other behaviors */
printf("fwc.sigset_set = %p\n", z->sigset_set);
printf("fwc.sigset_reset = %p\n", z->sigset_reset);

printf(fwc.indexset_set = %p\n", z->indexset_set);
printf(fwc.indexset_reset = %p\n", z->indexset_reset);

printf("fwc.compute = %p\n", z->compute);
printf("fwc.quadrature = %p\n", z->quadrature);
printf("\n");
};

void sigset_gset(struct fwc_type *z, struct sigset_type sigsetnew)
{
    /* This function sets the signature set of the finger wear computer to an
        argument-specified value */
    int ii;
    /* attributes*/
    for(ii = 0; ii < NSIGARRAY; ii++)
        z->sigset.sigarray[ii] = sigsetnew.sigarray[ii];
    z->sigset.beltspeed = sigsetnew.beltspeed;
    z->sigset.bcondition = sigsetnew.bcondition;
    z->sigset.timephoto = sigsetnew.timephoto;
};

void sigset_greset(struct fwc_type *z)
```

```
{
    /* This function resets the signature set of the finger wear computer to a default
        value */
    int ii;
    /* attributes */
    for(ii = 0; ii < NSIGARRAY; ii++)
        z->sigset.sigarray[ii] = 0.0000;
    z->sigset.beltspeed = 1.0000;
    z->sigset.bcondition = BGOOD;
    z->sigset.timephoto = 0.0000;
};

void indexset_gset(struct fwc_type *z, struct indexset_type indexsetnew)
{
    /* This function sets the index set of the finger wear computer to an argument-
        specified value */
    /* attributes */
    z->indexset = indexsetnew;
};

void indexset_greset(struct fwc_type *z)
{
    /* This function resets the index set of the finger wear computer to a default
        value */
    /* attributes */
    z->indexset.index = 0.0000;
    z->indexset.cutoff = ICUTOFF;
};

void fwc_gcompute(struct fwc_type *z)
{
    /* This function of the finger wear computer determines the finger wear index */
    /* mother wavelet is obtained from mother wavelet computer */
    /* current signature wavelet is obtained from signature wavelet computer */
    /* index is computed using fwc->quadrature */
    /* */
    /* */
    /* under certain conditions, compute mother wavelet */
    if(*MWC->mwdefined ! = COMPLETE /* if mother wavelet is not defined ... */
        || MCP->nfb_status == FBON) {/* ... or new fingers */
        if(MCP->nfb_status == FBON) {/* if new finger button has been depressed */
            MWC->icol = 0; /* signal to recompute mother wavelet */
```

```
        MCP->nfb_reset(MCP); /* reset new finger button */
    };
    MWC->compute(MWC); /* proceed with computation */
  } else { /* if mother wavelet is defined, proceed with computation */
    ASC->compute(ASC);
    if (*ASC->mwdefined == COMPLETE) {
      ASC->icol = 0; /* reset counter for next signature set */
      /* recompute index */
      z->indexset.index = z->quadrature(MWC->mwarray, ASC->mwarray);
    };
  };
};

double fwc_gquadrature(double *x1, double *x2)
{
  /* This function of the finger wear computer determines the integral by
     numerical quadrature of the product of two functions given in discretized
     form assuming unit-spaced equidistant sample points */
  /* generate quadrature */
  int ii;
  double xx;
  xx = 0.0;
  for(ii = 0; ii < NSIGARRAY; ii++)
    xx += x1[ii] * x2[ii];
  return (xx);
};
/* finger wear computer: END */

/* mother wavelet computer: START */
void mwc_type_init(struct mwc_type *z, int * mwdefined)
{
  /* This function initializes the attributes and behaviors associated with the
     mother wavelet computer */
  /* attributes */
  z->this = z; /* pointer to itself */
  z->mwdefined = mwdefined; /* mother wavelet computation status */
  mwc_mwa_reset(z); /* reset mother wavelet array */
  mwc_ncol_reset(z); /* reset number of collection units */
  mwc_snm_reset(z); /* reset speed normalization mode */
  mwc_icol_reset(z); /* reset current collection unit number */
  /* behaviors */
  /* standard behaviors */
```

```
  z->mwc_type_init = mwc_type_init;
  /* other behaviors */
  z->mwa_set = mwc_mwa_set;
  z->mwa_reset = mwc_mwa_reset;
  z->mwa_get = mwc_mwa_get;

z->ncol_set = mwc_ncol_set;
  z->ncol_reset = mwc_ncol_reset;
  z->ncol_get = mwc_ncol_get;

z->snm_set = mwc_snm_set;
  z->snm_reset = mwc_snm_reset;
  z->snm_get = mwc_snm_get;

z->icol_set = mwc_icol_set;
  z->icol_reset = mwc_icol_reset;
  z->icol_get = mwc_icol_get;

z->compute = mwc_gcompute;
  z->wtize = mwc_gwtize;
};

void mwc_type_gprint(struct mwc_type *z)
{
  /* This function prints the attributes and [pointers to] behaviors associated with
     the mother wavelet computer */
  int ii;
  /* attributes */
  printf("\n");
  printf("mwc.this = %p\n", z->this);
  printf("*mwc.mwdefined = %d\n", *z->mwdefined);
  for(ii = 0; ii < NSIGARRAY; ii++)
    printf("%p->mwarray[%i] = %g\n", z, ii, z->mwarray[ii]);
  printf("mwc.ncol = %i\n", z->ncol);
  printf("mwc.snm = %i\n", z->snm);
  printf("mwc.icol = %i\n", z->icol);
  printf("mwc.mwc_type_init = %p\n", z->mwc_type_init);

printf("mwc.mwa_set = %p\n", z->mwa_set);
  printf("mwc.mwa_reset = %p\n", z->mwa_reset);
  printf("mwc.mwa_get = %p\n", z->mwa_get);
```

```
    printf("mwc.ncol_set = %p\n", z->ncol_set);
    printf("mwc.ncol_reset = %p\n", z->ncol_reset);
    printf("mwc.ncol_get = %p\n", z->ncol_get);

printf("mwc.snm_set = %p\n", z->snm_set);
    printf("mwc.snm_reset = %p\n", z->snm_reset);
    printf("mwc.snm_get = %p\n", z->snm_get);

printf("mwc.icol_set = %p\n", z->icol_set);
    printf("mwc.icol_reset = %p\n", z->icol_reset);
    printf("mwc.icol_get = %p\n", z->icol_get);

printf("mwc.compute = %p\n", z->compute);
    printf("mwc.wtize = %p\n", z->wtize);
    printf("\n");
};

void mwc_mwa_set(struct mwc_type *z, double * mwanew)
{
    /* This function sets the mother wavelet array of the mother wavelet computer to
       an argument-specified value */
    int ii;
    /* attributes */
    for (ii = 0; ii < NSIGARRAY; ii++)
        z->mwarray[ii] = mwanew[ii];
};

void mwc_mwa_reset(struct mwc_type *z)
{
    /* This function resets the mother wavelet array of the mother wavelet computer
       to a null array */
    int ii;
    /* attributes */
    for(ii = 0; ii < NSIGARRAY; ii++)
        z->mwarray[ii] = ZERO;
};

double * mwc_mwa_get(struct mwc_type *z)
{
    /* This function returns a pointer to the mother wavelet array of the mother
       wavelet computer */
    /* attributes */
```

```
    return z->mwarray;
};

void mwc_ncol_set(struct mwc_type *z, int ncolnew)
{
    /* This function sets the number of collection units of the mother wavelet
        computer to an argument-specified value */
    /* attributes */
    z->ncol = ncolnew;
};

void mwc_ncol_reset(struct mwc_type *z)
{
    /* This function resets the number of collection units of the mother wavelet
        computer to a header-file-specified default value */
    z->ncol = NCOL0;
};

int mwc_ncol_get(struct mwc_type *z)
{
    /* This function returns the number of collection units of the mother wavelet
        computer */
    /* attributes */
    return z->ncol;
};

void mwc_snm_set(struct mwc_type *z, int snmnew)
{
    /* This function sets the speed normalization mode of the mother wavelet
        computer to an argument-specified value */
    /* attributes */
    z->snm = snmnew;
};

void mwc_snm_reset(struct mwc_type *z)
{
    /* This function resets the speed normalization mode of the mother wavelet
        computer */
    z->snm = SOFF;
};

int mwc_snm_get(struct mwc_type *z)
```

```
{
    /* This function returns the speed normalization mode of the mother wavelet
       computer */
    /* attributes */
    return z->snm;
};

void mwc_icol_set(struct mwc_type *z, int icolnew)
{
    /* This function sets the current collection unit number of the mother wavelet
       computer to an argument-specified value */
    /* attributes */
    z->icol = icolnew;
};

void mwc_icol_reset(struct mwc_type *z)
{
    /* This function resets the current collection unit number of the mother wavelet
       computer to zero */
    z->icol = ZERO;
};

int mwc_icol_get(struct mwc_type *z)
{
    /* This function returns the current collection unit number of the mother wavelet
       computer */
    return z->icol;
};

void mwc_gcompute(struct mwc_type *z)
{
    /* This function of the mother wavelet computer determines the mother wavelet */
    /* */
    /* */
    int ii;

/* collection: initiate */
    /* under certain conditions, initiate the collection process */
    if(z->icol == 0) {/* z->icol is zero initially and after the new finger button has
                        been depressed */
        /* initialize collection process variables */
        z->mwc_type_init(z, z->mwdefined); /* set default values */
```

```
/* some data is governed by the local control panel:
        number of collection units
        speed normalization mode */
    z->ncol_set(z, LCP->ncol);
    z->snm_set(z, LCP->snm);
    *z->mwdefined = START;
};
/* collection: continue */
/* under certain conditions, continue the collection process */
if(z->icol < z->ncol) { /* z->icol units collected thus far */
    /* update collection process variables */
    *z->mwdefined = COLLECT;
    if (FWC->sigset.bcondition == BGOOD){/* if unit condition is good */
        for(ii = 0; ii<NSIGARRAY; ii++)
            z->mwarray[i] += FWC->sigset.sigarray[ii];
        z->icol++; /* update number of collected units */
    /* collection; complete */
    /* under certain conditions, complete the collection process */
    if (z->icol == z->ncol) {/* desired number of collected units reached */
        for(ii = 0; ii<NSIGARRAY; ii++)
            z->mwarray[ii] /= z->ncol;
        z->wtize(z->mwarray);
        z->icol++; /* update number of collected units */
        *z->mwdefined = COMPLETE;
    };
  };
 };
};

void mwc_gwtize(double *x)
{
    /* This function of the mother wavelet computer determines the wavelet form of
        a function given in discretized form assuming unit-spaced equidistant sample
        points */
    /* generate mother wvaelet */
    int ii;
    double xx;
    xx = 0.0;
    for(ii = 0; ii < NSIGARRAY; ii++)
        xx += x[ii];
    xx /= NSIGARRAY;
    for(ii = 0; ii < NSIGARRAY; ii++)
```

```
    x[ii] = xx;
  xx = 0.0;
  for(ii = 0; ii < NSIGARRAY; ii++)
    xx += x[ii]* x[ii];
  xx = sqrt(xx);
  if(xx == 0.0) { /* avoid division by zero pathological case */
    xx = 1.0;
  };
  for(ii = 0; ii < NSIGARRAY; ii++)
    x[ii] /= xx;
};

/* mother wavelet computer: END */

/* interfacing functions: START */
void init_wear(void)
{
  /* This function initializes the wavelet based finger wear computation */

/* save object addresses: START */
  MCP = &mcp;
  LCP = &lcp;
  FWC = &fwc;
  MWC = &mwc;
  ASC = &asc;
  /* save object addresses: END */

/* initialize objects: START */
  mcp_type_ginit(MCP);
  lcp_type_ginit(LCP);
  fwc_type_ginit(FWC);
  mwc_type_init(MWC, &MWDEFINEDM);
  mwc_type_init(ASC, &MWDEFINEDA);
  /* initialize objects: END */

/* change default number of collection units for test only: START */
  LCP->ncol_set(LCP, 1);
  /* change default number of collection units for test only: END */

/* optionally print objects: START
  mcp_type_gprint(MCP);
  lcp_type_gprint(LCP);
```

```
        fwc_type_gprint(FWC);
        mwc_type_gprint(MWC);
        mwc_type_gprint(ASC);
        optionally print objects: END */ printf("\n\nWavelet Based Finger Wear Test Computation Initiated\n\n");

};

void test_wear(void)
{
    /* This function tests the wavelet based finger wear computation */
    /* define test data */
    #include "fwc_data.h"
    /* test driver program */
    int ii;
    for(ii = 0; ii < NSIGSTREAM; ii++)
      {
        printf("pass = %5i: \n", ii+1);
        if(fmod(ii, 4) == 0) {
            /* press new finger button every 4 signatures */
            MCP->nfb_set(MCP);
        };
        /* load current signature set */
        sigset_gset(FWC, signature_stream[ii]);
        /* compute finger wear index */
        FWC->compute(FWC);
        /* print finger wear index */
        printf("FWC->indexset.index = %10g << \n", FWC->indexset.index);
      };
};

void shutdown_wear(void)
{
    /* This function is performed after ending the wavelet based finger wear
       computation */
    printf("\n\nWavelet Based Finger Wear Test Computation Completed\n\n");

};
/* interfacing functions: END */

/* main program: START */
```

```
void main(void)
{
  /* This is a test driver program for the wavelet based finger wear computation */
  init_wear();
  test_wear();
  shutdown_wear();
};
/* main program: END */

/* executable file: END */
```

What is claimed is:

1. A method of detecting wear in a battery tester probe, comprising the steps of:

provoding a battery tester unit having at least one tester finger for coupling to a battery to be tested;

generating a tester signal using said tester fingers and said battery tester unit, the tester signal characteristic of at least one of the electrochemical condition of the battery and said tester finger;

applying wavelet transformation, including computing a mother wavelet, to the tester signal to produce finger wear indicator signals;

analyzing the finger wear indicator signals to compute a finger wear index;

comparing the finger wear index for the tester finger with the index for a new tester finger; and generating a tester finger change signal to indicate a threshold wear change of the tester finger upon exceeding a preset finger wear index.

2. The method as defined in claim 1 further including the step of separating from the tester signal information associated with the electrochemical state of the battery.

3. The method as defined in claim 1 wherein information characteristic of the mother wavelet for a new tester is stored in a RAM.

4. The method as defined in claim 1 further including the step of adjusting the preset finger wear index.

5. The method as defined in claim 1 wherein the tester signal is manipulated to calculate an average test signature.

6. The method as defined in claim 1 wherein the step of applying wavelet transformation comprises periodically performing the calculation to ascertain the changing condition of the tester finger.

7. A method of detecting wear in a battery tester probe, comprising the steps of:

providing a battery tester unit having at least one tester finger for coupling to a battery to be tested;

actuating a test of a new tester finger;

loading into a computer current finger wear signature data;

computing a finger wear index by computing a mother wavelet for the current tester finger, the step of computing a mother wavelet including computing an average finger wear signature and converting the average signature into wavelet form; and generating a tester finger status signal characteristic of the degree of wear for said tester finger.

* * * * *

UNITED STATES PATENT AND TRADEMARK OFFICE
CERTIFICATE OF CORRECTION

PATENT NO. : 5,689,429

DATED : November 18, 1997

INVENTOR(S) : Eduardo V. Depiante

It is certified that error appears in the above-identified patent and that said Letters Patent is hereby corrected as shown below:

In Column 2, line 11, delete "carded" and insert --carried--.
In Column 4, line 54, delete "Them" and insert --There--.
In Column 51, line 19, delete the line break (⏎) at the end of the line.

Signed and Sealed this

Twenty-ninth Day of September, 1998

Attest:

BRUCE LEHMAN

Attesting Officer

Commissioner of Patents and Trademarks